(12) United States Patent
Suzuki et al.

(10) Patent No.: US 9,564,930 B2
(45) Date of Patent: Feb. 7, 2017

(54) MEMORY CONTROLLER, STORAGE DEVICE AND MEMORY CONTROL METHOD

(71) Applicant: Kabushiki Kaisha Toshiba, Minato-ku (JP)

(72) Inventors: Riki Suzuki, Yokohama (JP); Toshikatsu Hida, Yokohama (JP); Mitsunori Tadokoro, Fujisawa (JP); Yoshihisa Kojima, Kawasaki (JP); Shohei Asami, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 35 days.

(21) Appl. No.: 14/636,768

(22) Filed: Mar. 3, 2015

(65) Prior Publication Data

US 2016/0072527 A1    Mar. 10, 2016

Related U.S. Application Data

(60) Provisional application No. 62/046,197, filed on Sep. 5, 2014.

(51) Int. Cl.

| | |
|---|---|
| *G11B 20/18* | (2006.01) |
| *H03M 13/29* | (2006.01) |
| *H03M 13/00* | (2006.01) |
| *G06F 11/10* | (2006.01) |
| *H03M 13/15* | (2006.01) |
| *H03M 13/37* | (2006.01) |
| *H03M 13/43* | (2006.01) |

(52) U.S. Cl.
CPC ...... *H03M 13/2906* (2013.01); *G06F 11/1008* (2013.01); *H03M 13/152* (2013.01); *H03M 13/3738* (2013.01); *H03M 13/613* (2013.01); *H03M 13/6356* (2013.01); *H03M 13/3769* (2013.01); *H03M 13/43* (2013.01)

(58) Field of Classification Search
CPC .................................................. G11B 20/1833
USPC ........................................ 714/769, 755, 762
See application file for complete search history.

(56) References Cited

U.S. PATENT DOCUMENTS

| | | | |
|---|---|---|---|
| 5,463,646 A | 10/1995 | Dillon et al. | |
| 7,900,125 B1 | 3/2011 | Liu et al. | |
| 9,093,118 B2 | 7/2015 | Tashiro et al. | |
| 2009/0300466 A1 | 12/2009 | Yoshimura | |

(Continued)

FOREIGN PATENT DOCUMENTS

| | | |
|---|---|---|
| JP | 2009-289310 A | 12/2009 |
| JP | 2014-182848 A | 9/2014 |

*Primary Examiner* — Fritz Alphonse
(74) *Attorney, Agent, or Firm* — Oblon, McClelland, Maier & Neustadt, L.L.P.

(57) ABSTRACT

According to one embodiment, a memory controller includes an encoding unit that generates a first code word, a duplication unit that duplicates the first code word, a memory interface that writes a code word group including the first code word and code words being duplicates of the first code word into a non-volatile memory, and reads the code words forming the code word group from the non-volatile memory, a determination unit that obtains a result of majority decision using the first code word and the plurality of code words, which are included in the code word group read from the non-volatile memory, and a decoding unit that decodes a code word being the result of the majority decision and corrects an error.

19 Claims, 9 Drawing Sheets

(56) References Cited

U.S. PATENT DOCUMENTS

| | | |
|---|---|---|
| 2010/0223532 A1 | 9/2010 | Kang et al. |
| 2013/0111166 A1* | 5/2013 | Resch ................. G06F 11/1076 711/162 |
| 2015/0261604 A1* | 9/2015 | Sugiyama .............. G11C 29/52 714/764 |

* cited by examiner

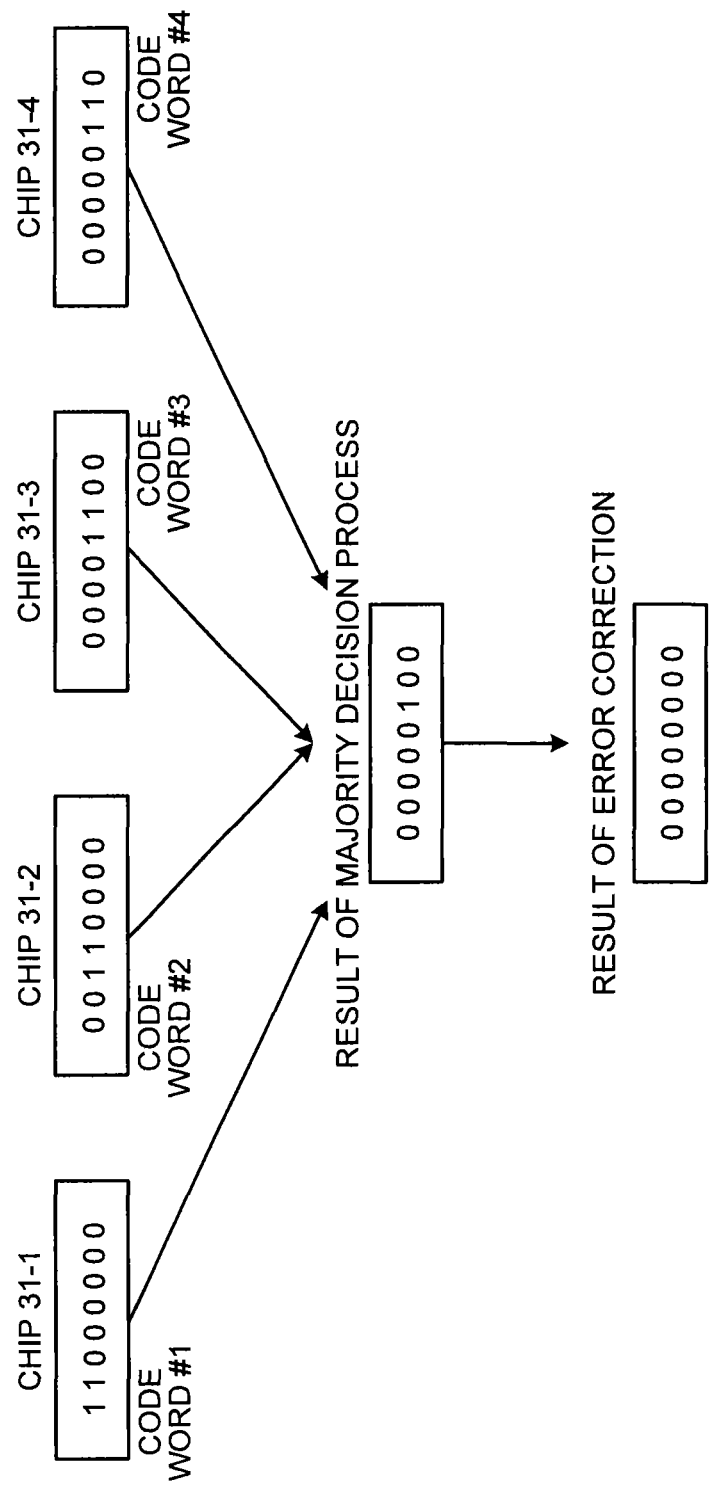

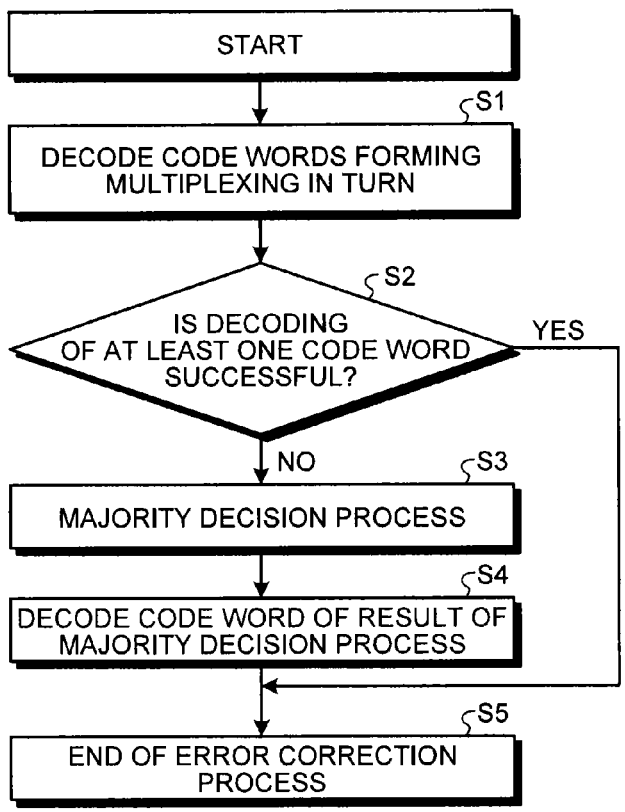

| CHIP31-1 | | | |
|---|---|---|---|
| FIRST CODE WORD #1 | FIRST CODE WORD #2 | FIRST CODE WORD #3 | FIRST CODE WORD #4 |
| SECOND CODE WORD #1 | SECOND CODE WORD #2 | SECOND CODE WORD #3 | SECOND CODE WORD #4 |
| THIRD CODE WORD #1 | THIRD CODE WORD #2 | THIRD CODE WORD #3 | THIRD CODE WORD #4 |
| ⋮ | | | |

# US 9,564,930 B2

MEMORY CONTROLLER, STORAGE DEVICE AND MEMORY CONTROL METHOD

CROSS-REFERENCE TO RELATED APPLICATIONS

This application is based upon and claims the benefit of priority from U.S. Provisional Application No. 62/046,197, filed on Sep. 5, 2014; the entire contents of which are incorporated herein by reference.

FIELD

Embodiments described herein relate generally to a memory controller, a storage device, and a memory control method.

BACKGROUND

Methods for protecting data stored in a memory such as a NAND flash memory (hereinafter referred to as a NAND memory) include a method for storing, in a memory, a code word generated by encoding data with an error-correcting code. Moreover, in some cases, one code word is duplicated to store the duplicated code words in a plurality of places in the memory, and accordingly the improvement of error correction capability is promoted.

BRIEF DESCRIPTION OF THE DRAWINGS

FIG. 4 is a schematic diagram illustrating a concept of a majority decision process of the first embodiment;

FIG. 5 is a flowchart illustrating an example of an error correction process procedure of stored multiplexed data of the first embodiment;

FIG. 6 is a diagram illustrating an example of a storage method for distributing a code word group across CHIPs;

DETAILED DESCRIPTION

According to an embodiment, a memory controller that controls a non-volatile memory includes an encoding unit that encodes data and generates a first code word, a duplication unit that duplicates the first code word, and a memory interface that writes, into the non-volatile memory, a code word group including the first code word and code words being duplicates of the first code word and reads the code words forming the code word group from the non-volatile memory. Moreover, the memory controller includes a determination unit that obtains a result of majority decision, using the first code word and the plurality of code words, which are included in the code word group, and a decoding unit that decodes a code word being the result of the majority decision and corrects an error.

Exemplary embodiments of a memory controller, a storage device, and a memory control method will be explained below in detail with reference to the accompanying drawings. The present invention is not limited to the following embodiments.

(First Embodiment)

Figure 1:
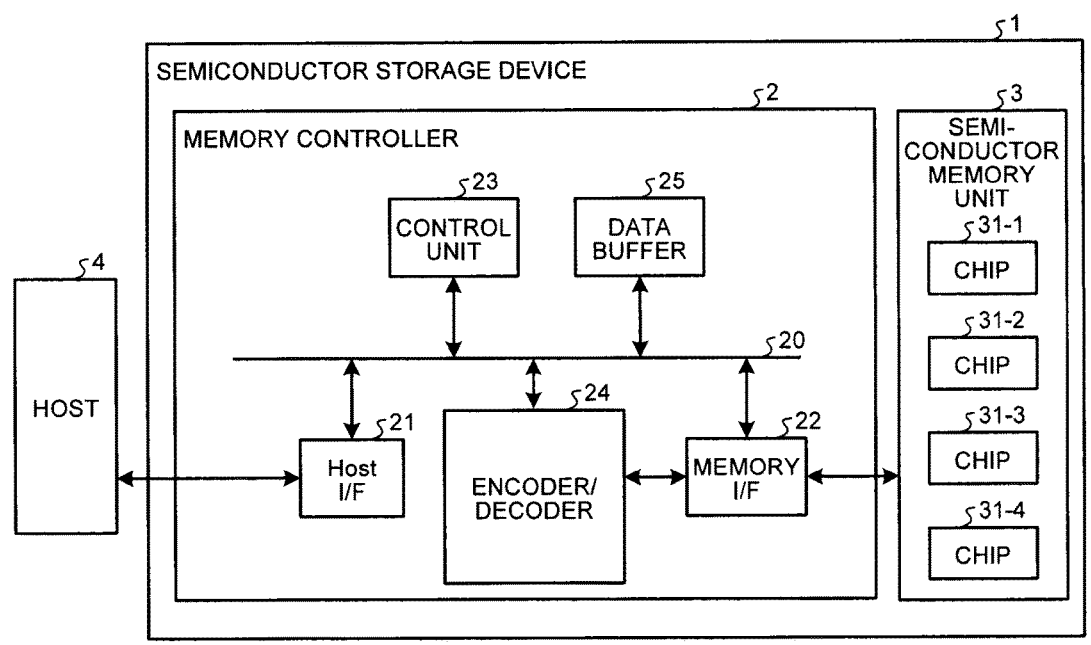
FIG. 1 is a block diagram illustrating a configuration example of a storage device (semiconductor storage device) according to a first embodiment.

FIG. 1 is a block diagram illustrating a configuration example of a storage device (semiconductor storage device) according to a first embodiment. A semiconductor storage device 1 of the embodiment includes a memory controller 2 and a semiconductor memory unit (non-volatile memory) 3. The semiconductor memory device 1 can be connected to a host 4. FIG. 1 illustrates a state where the semiconductor storage device 1 is connected to the host 4. The host 4 is, for example, electronic equipment such as a personal computer or a mobile terminal.

The semiconductor memory unit 3 is a non-volatile memory in which data is stored in a nonvolatile manner, and is, for example, a NAND memory. An example where a NAND memory is used as the semiconductor memory unit 3 is described here. However, storage means other than the NAND memory, such as a three-dimensional flash memory, ReRAM (Resistance Random Access Memory), FeRAM (Ferroelectric Random Access Memory) may be used as the semiconductor memory unit 3. Moreover, an example where the semiconductor memory is used as the storage means is described here. However, an error correction process of the embodiment may be applied to a storage device using storage means other than the semiconductor memory.

The memory controller 2 controls writing into the semiconductor memory unit 3 in accordance with a write command (request) of the host 4. Moreover, the memory controller 2 controls reading from the semiconductor memory unit 3 in accordance with a read command of the host 4. The memory controller 2 includes a Host I/F (host interface) 21, a memory I/F (memory interface) 22, a control unit 23, an encoding unit/decoding unit (Encoder/Decoder) 24, and a data buffer 25. The Host I/F 21, the memory I/F 22, the control unit 23, the encoding unit/decoding unit 24, and the data buffer 25 are connected by an internal bus 20.

The semiconductor memory unit 3 is connected to the memory controller 2 via one or more channels. Each channel controls a plurality of memory chips sharing a control I/O signal on a bank-by-bank basis. Moreover, a ready/busy signal is shared across the plurality of channels. The semiconductor memory unit 3 performs control such that the memory chips of each channel sharing the ready/busy signal operate simultaneously. A group of memory chips sharing the ready/busy signal is referred to as a bank. Each bank can perform a write/read/erase operation independently. A bank includes a plurality of memory chips.

The semiconductor memory unit 3 includes one or more memory chips (CHIPs). In FIG. 1, four CHIPs, CHIPs 31-1 to 31-4, are illustrated. However, the number of CHIPs is not limited to four. The CHIPs 31-1 to 31-4 may belong to one bank, or to different banks. In other words, the semiconductor memory unit 3 may be configured of one bank or of a plurality of banks.

The Host I/F 21 performs a process in compliance with an interface standard in between with the host 4, and outputs, to the internal bus 20, a command, user data, and the like that are received from the host 4. Moreover, the Host I/F 21 transmits, to the host 4, user data read from the semiconductor memory unit 3, a response from the control unit 23, and the like. In the embodiment, data to be written into the semiconductor memory unit 3 at a write request of the host 4 is referred to as the user data.

The memory I/F 22 performs a write process of write data into the semiconductor memory unit 3 based on an instruction of the control unit 23. Moreover, the memory I/F 22 performs a read process from the semiconductor memory unit 3 based on an instruction of the control unit 23.

The control unit 23 is a control unit that performs centralized control over the components of the semiconductor storage device 1. When having received a command from the host 4 via the Host I/F 21, the control unit 23 performs control in accordance with the command. For example, the control unit 23 instructs the memory I/F 22 to write the user data and parity into the semiconductor memory unit 3 in accordance with the command of the host 4. Moreover, the control unit 23 instructs the memory I/F 22 to read the user data and parity from the semiconductor memory unit 3 in accordance with the command of the host 4. Moreover, some data other than user data, in other words, data to be used for internal control of the semiconductor storage device 1 (hereinafter referred to as the control data) is also stored in the semiconductor memory unit 3. The control data contains an address translation table used to manage the correspondence between a logical address and a physical address of data stored in the semiconductor memory unit 3. Moreover, the control data contains a table that manages information on the status of a block, for example, whether the block is in an erased status or whether the block is available. The control unit 23 instructs the memory I/F 22 to write and read these pieces of the control data.

Moreover, when having received a write request from the host 4, the control unit 23 decides a storage area (memory area) in the semiconductor memory unit 3 for the user data to be accumulated in the data buffer 25. In other words, the control unit 23 manages a write destination with which a write destination of the user data is decided. As described below, in the embodiment, one code word is duplicated to be distributed to and stored in a plurality of memory areas on a plurality of the semiconductor memory unit 3. The control unit 23 decides and manages a plurality of storage locations corresponding to one code word. The correspondence between a logical address of the user data received from the host 4 and a physical address indicating a storage area on the semiconductor memory unit 3 where the user data is stored is stored as the address translation table.

Moreover, when having received a read request from the host 4, the control unit 23 translates a logical address specified by the read request to a physical address, using the above-mentioned address translation table, and instructs the memory I/F 22 to perform a read from the physical address.

Figure 2:
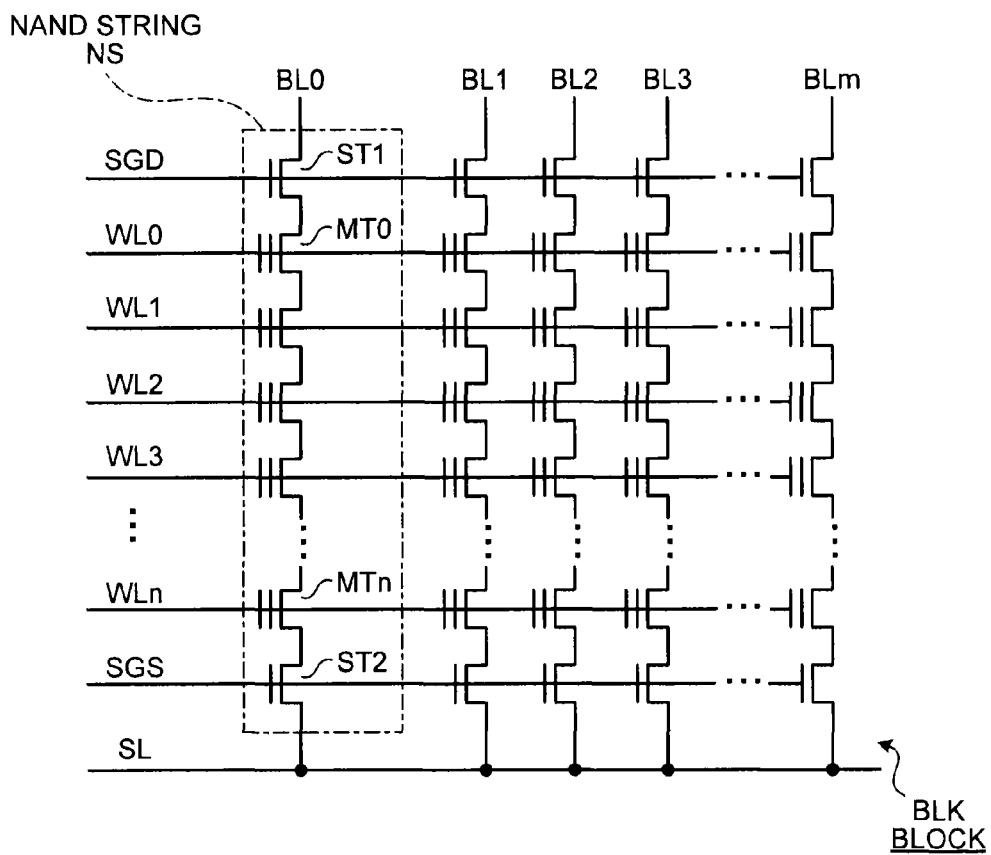
FIG. 2 is a diagram illustrating a configuration example of a block of a NAND memory.

In the NAND memory, generally, a write and a read are performed in units of data referred to as a page, and an erasure is performed in units of data referred to as a block. FIG. 2 is a diagram illustrating a configuration example of a block of the semiconductor memory unit 3 which is the NAND memory. As illustrated in FIG. 2, a block BLK of the semiconductor memory unit 3 includes (m+1) (m is an integer equal to or greater than zero) NAND strings NS. Each NAND string NS includes (n+1) (n is an integer equal to or greater than zero) memory cell transistors MT0 to MTn connected in series sharing a diffusion region (source or drain region) between adjacent memory cell transistors MT, and select transistors ST1 and ST2 disposed at both ends of a column of the (n+1) memory cell transistors MT0 to MTn.

Control gate electrodes of the memory cell transistors MT0 to MTn configuring the NAND string NS are connected respectively to word lines WL0 to WLn. Memory cell transistors MTi (i=0 to n) of the NAND strings NS are commonly connected to the same word line Li (i=0 to n). In other words, the control gate electrodes of the memory cell transistors MTi in the same row in the block BLK are connected to the same word line WLi.

Each of the memory cell transistors MT0 to MTn is configured of a field-effect transistor having a stacked gate structure formed on a semiconductor substrate. The stacked gate structure includes a charge trapping layer (floating gate electrode) formed on the semiconductor substrate with a gate insulating film interposed therebetween, and a control gate electrode formed on the charge trapping layer with an inter-gate insulating film interposed therebetween. The memory cell transistors MT0 to MTn change in the threshold voltage depending on the number of electrons that can be stored in the floating gate electrode, and can store data according to the difference of the threshold value.

Drains of (m+1) select transistors ST1 in one block BLK are connected respectively to bit lines BL0 to BLm, and their gates are commonly connected to a selection gate line SGD. Moreover, sources of the select transistors ST1 are connected to drains of the memory cell transistors MT0. Similarly, sources of (m+1) select transistors ST2 in one block are commonly connected to a source line SL, and their gates are commonly connected to a selection gate line SGS. Moreover, drains of the select transistors ST2 are connected to sources of the memory cell transistors MTn.

In the embodiment, the (m+1) memory cell transistors MTi connected to the same word line WLi are referred to as a memory cell group. If a memory cell is a single-level cell (SLC), one memory cell group corresponds to one page. If a memory cell is a multi-level cell (MLC), one memory cell group corresponds to a plurality of pages. Moreover, each memory cell is connected to a word line and is also connected to a bit line. Each memory cell can be identified from an address identifying a word line and an address identifying a bit line.

The data buffer 25 temporarily stores the user data received by the memory controller 2 from the host 4 until storing the user data in the semiconductor memory unit 3. Moreover, the data buffer 25 temporarily stores the user data read from the semiconductor memory unit 3 until transmitting the user data to the host 4. The data buffer 25 is configured of a general-purpose memory, for example, an SRAM (Static Random Access Memory) or a DRAM (Dynamic Random Access Memory).

The user data transmitted from the host 4 is transferred to the internal bus 20 and stored in the data buffer 25. The encoding unit/decoding unit 24 encodes data (the user data and control data) to be stored in the semiconductor memory unit 3 and generates a code word. The encoding scheme of the user data may be different from or the same as the encoding scheme of the control data. Moreover, any scheme may be used as the encoding scheme. For example, RS (Reed Solomon) encoding, BCH (Bose Chaudhuri Hocquenghem) encoding, or LDPC (Low Density Parity Check Code) encoding can be used. Moreover, the encoding unit/ decoding unit 24 performs a decoding process on a code word read from the semiconductor memory unit 3. The decoding process of the embodiment is described in detail below.

A scheme for multiplexing coding such as a product code, a scheme for duplicating, multiplexing, and storing data (a code word) itself, and the like are conceivable as a scheme for improving the error correction capability. In the scheme for multiplexing coding, the data size in units of coding (units of data forming one product code in a case of a product code) is increased. Accordingly, the scheme for multiplexing coding may not be efficient when protecting a small amount of data. The control data contains data that is small in amount but requires high reliability. The scheme may be used which duplicates, multiplexes, and stores data (a code word) itself to protect such data.

In the embodiment, one code word is duplicated for at least part of the control data to be stored in a plurality of areas of the semiconductor memory unit 3. In other words, one code word is multiplexed to be stored in the semiconductor memory unit 3. The example where the control data is multiplexed to be stored in the semiconductor memory unit 3 is described here. However, at least part of the user data may similarly be multiplexed to be stored in the semiconductor memory unit 3.

If the manner in which an error occurs and the number of errors are different depending on the location to store the data, a code word is multiplexed and stored in different locations to enable the improvement of the error correction capability. On the other hand, if storage is simply multiplexed and decoded, each code word is decoded independently. Hence, all the code words have errors at the same level. If the error correction was unsuccessful for all of single code words, correct data cannot be recovered. On the other hand, if bit locations where an error has occurred are respectively different among a plurality of code words duplicated from the same code word, a bit value at a bit location having an error in a certain code word may be correct in another code word. However, which bit is correct and which bit has an error cannot be distinguished if not being processed. If errors occur randomly, the possibility that an error of a bit value occurs at the same bit location in all the code words is low. Therefore, in the embodiment, if error corrections of the plurality of code words duplicated from the same code word individually result in failure, a majority decision process is performed, bit by bit, on the plurality of code words. A code word as a result of the majority decision, in other words, a code word obtained by the majority decision process is decoded and accordingly the probability of successful error correction is increased.

Hereinafter, a description is given of a writing method and reading method for multiplexing and storing in the semiconductor memory unit 3. In the following, a description is mainly given of a writing method (including an encoding method) and reading method (including a decoding method) of the control data that is multiplexed and stored in the semiconductor memory unit 3 (hereinafter referred to as the stored multiplexed data). There is no particular constraint on a writing method and reading method of data other than the stored multiplexed data, and any method can be used.

Figure 3:
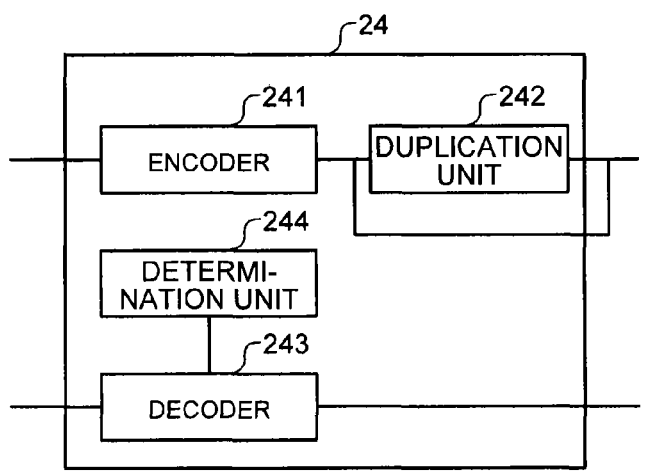
FIG. 3 is a diagram illustrating a configuration example of an encoding unit/decoding unit of the first embodiment.

FIG. 3 is a diagram illustrating a configuration example of the encoding unit/decoding unit 24 of the embodiment. The encoding unit/decoding unit 24 includes an encoding unit 241, a duplication unit 242, a decoding unit 243, and a determination unit 244. The encoding unit 241 encodes the stored multiplexed data, generates a code word, and inputs the generated code word into the duplication unit 242, based on an instruction of the control unit 23. The duplication unit 242 duplicates the code word and outputs the code words to the memory I/F 22.

Moreover, the encoding unit 241 encodes the data other than the stored multiplexed data, generates a code word, and outputs the code word to the memory I/F 22, based on an instruction of the control unit 23. As described above, the encoding scheme of the stored multiplexed data may be different from or the same as the encoding scheme of the data other than the stored multiplexed data. The stored multiplexed data is multiplexed and stored as described above. Hence, reliability is required to be secured as results of both encoding, and multiplexing and storing. The error correction capability (the maximum number of correctable errors when a code word is decoded) in the encoding of the stored multiplexed data does not need to be so high. In the embodiment, BCH encoding that can correct a one-bit error is assumed to be used for encoding of the stored multiplexed data.

Moreover, for example, if the data other than the stored multiplexed data is encoded with a two-dimensional product code, the same encoding scheme as first-dimensional encoding of a product code may be used. In this case, the encoding of the data other than the stored multiplexed data and the hardware can be made common.

The memory I/F 22 stores code words duplicated by the duplication unit 242 in the semiconductor memory unit 3 based on an instruction of the control unit 23. The control unit 23 instructs the memory I/F 22 to distribute and store a plurality of code words generated by duplicating the same code word to and in different memory areas in the semiconductor memory unit 3. At this point in time, the control unit 23 decides physical addresses where the plurality of code words is stored and instructs the memory I/F 23. The physical addresses where the plurality of code words is stored may be predetermined, or a physical address of a storage destination may be decided by the control unit 23 upon each write. The control unit 23 may manage the physical addresses where the duplicated code words are stored, using the above-mentioned address translation table or a management table dedicated for the stored multiplexed data. When stored in the semiconductor memory unit 3, it is desirable that the plurality of code words be distributed to and stored in areas each having a different degree of reliability (the probability of occurrence of an error). However, there is no constraint on a specific distribution method. For example, the code words may be distributed across CHIPs, blocks, or pages. Hereinafter, a plurality of code words generated by duplicating the same code word is referred to as a code word group.

Next, a description is given of the process of reading a code word generated based on the stored multiplexed data. When reading out the stored multiplexed data, the control unit 23 instructs the memory I/F 22 to read, from the semiconductor memory unit 3, N (N is an integer equal to or greater than one) code words within a code word group generated based on the stored multiplied data. The memory I/F 22 reads the code words from the semiconductor memory unit 3 based on the instruction of the control unit 23.

If the user data is multiplexed and stored in the semiconductor memory unit 3, a write is performed in a multiplexed manner at a write request of the host 4, and a read of a code word generated based on the stored multiplexed data is performed at a read request of the host. Moreover, if the control data is multiplexed and stored in the semiconductor memory unit 3, when the control data is data used upon reading of the user data, a code word generated based on the stored multiplexed data is read at a read request of the host.

An example where N=1 is described here. The decoding unit 243 decodes a code word read from the semiconductor memory unit 3 and, if there is an error in the code word and the error is correctable, corrects the error. If the code word includes errors exceeding the error correction capability that is decided according to the encoding scheme and amount of redundant data (parity) of the code word, the decoding unit 243 fails to correct the errors. The decoding unit 243 notifies the control unit 23 whether or not the error correction could not be made after decoding. The decoding unit 243 judges that the error correction could be made if an error is not included in the code word.

When having received the notification indicating the failure in the error correction from the decoding unit 243, the control unit 23 instructs the memory I/F 22 to read, from the semiconductor memory unit 3, another code word that has not been read among the above-mentioned code word group. Similarly, the decoding unit 243 decodes the code word and notifies the control unit 23 whether or the error correction could be made. Until receiving a notification indicating that the error correction could be made, the control unit 23 performs control in such a manner as to sequentially read other code words that have not been read among the code word group. The decoding unit 243 then sequentially decodes the code words read out. The code word failed in the error correction is held in the data buffer 25, or an unillustrated buffer in the encoding unit/decoding unit 24. If error corrections of all the code words within the code word group result in failure, the control unit 23 instructs the determination unit 244 to perform the majority decision process illustrated below.

The example where N=1 has been described. However, two or more code words within the code word group may be read at a time, assuming N=2 or greater. All the code words within the code word group may be read at a time. In this case, read code words are held in, for example, the data buffer 25 or the unillustrated buffer in the encoding unit/decoding unit 24, and the decoding unit 243 sequentially decodes the code words held. When the error corrections were successful, the process is ended. If error corrections of all the code words of the code word group result in failure, the control unit 23 instructs the determination unit 244 to perform the majority decision process illustrated below.

FIG. 4 is a schematic diagram illustrating a concept of the majority decision process of the embodiment. In the embodiment, assume that the same code word is duplicated, and four code words including the original code word is generated. In other words, one code word group is generated including four code words. Moreover, in the example of FIG. 4, the code words forming one code word group are distributed to and stored in four CHIPs, CHIPs 31-1 to 31-4. In FIG. 4, code words #1 to #4 denote the four code words forming the code word group. The code word #1 denotes a code word stored in the CHIP 31-1. The code word #2 denotes a code word stored in the CHIP 31-2 denotes. The code word #3 denotes a code word stored in the CHIP 31-3. The code word #4 denotes a code word stored in the CHIP 31-4.

FIG. 4 illustrates an example in which BCH encoding that can correct a one-bit error is used as described above. If the original code word, that is, the correct code word is "00000000", the code words #1 to #4 of the code word group corresponding to the correct code word are stored in the semiconductor memory unit 3. It is assumed that there is a two-bit error in each code word as illustrated in FIG. 4 when being subsequently read from the semiconductor memory unit 3. In this case, error corrections of all the code words #1 to #4, as single code words, result in failure.

In this case, the control unit 23 instructs the determination unit 244 to perform the majority decision process. The determination unit 244 calculates a result of the majority decision process on each bit value of the code words #1 to #4 on a bit-by-bit basis. In other words, assume that a first bit value of the code word #1 is "1", and all first bit values of the code words #2 to #4 are "0". In this case, there are three code words whose first bit value is "0", and one code word whose first bit value is "1". Accordingly, "0" outnumbers "1". Therefore, a result of the majority decision process of the first bits is "0". The determination unit 244 can be configured of, for example, a majority circuit. In the example of FIG. 4, a result of the majority decision process on a bit-by-bit basis is "00000100". The result of the majority decision process is also a code word.

If the number of code words forming a code word group is an odd number, "0" or "1" can always be obtained as a result of the majority decision. However, if the number of code words forming a code word group is an even number, "0" and "1" may be equal in number. For the process in this case, for example, the following process is performed. Firstly, "0" or "1" is determined as a temporary result, and set as a relevant bit value. A code word as a result of majority decision is calculated. If the error correction is successful after decoding, the error correction process ends as it is. If the error correction is unsuccessful, the bit value determined as the temporary result is changed to perform decoding again. For example, if decoding is performed using a bit value of a given bit set to "0" as a temporary result and the error correction is unsuccessful, a code word in which the above bit is set to "1" is decoded.

Next, the decoding unit 243 decodes the result of the majority decision process to make an error correction. The result of the majority decision process contains only a one-bit error. Accordingly, the decoding unit 243 succeeds in the error correction, and a result of the error correction is the value of the original code word, "00000000".

FIG. 5 is a flowchart illustrating an example of the error correction process (decoding process) procedure of the stored multiplexed data of the embodiment. Firstly, the control unit 23 performs control in such a manner as to in turn decode code words forming multiplexing, in other words, code words of a code word group (Step S1). As described above, the decoding unit 243 decodes the code words and notifies whether or not error correction is successful.

The control unit 23 judges whether or not the decoding of at least one code word is successful (Step S2). If the decoding of at least one code word was successful (Step S2 Yes), the control unit 23 ends the error correction process (Step S5). If the decoding of at least one code word was not successful (Step S2 No), the control unit 23 instructs the determination unit 244 to perform the majority decision process. The determination unit 244 performs the above-mentioned majority decision process (Step S3). The decoding unit 243 subsequently decodes a code word as a result of the majority decision process (Step S4), and ends the error correction process (Step S5).

As described above, the process of decoding code words generated based on the data other than the stored multiplexed data is a decoding process corresponding to encoding, and there is no special constraint. Therefore, the detailed description is omitted.

FIGS. 1 and 3 illustrate the configuration example where the encoding unit/decoding unit 24 and the memory I/F 22 are provided separately. However, the encoding unit/decoding unit 24 may be provided inside the memory I/F 22. Moreover, in the example of FIG. 3, the duplication unit 242 is provided inside the encoding unit/decoding unit 24. However, the duplication unit 24 may be provided separately from the encoding unit/decoding unit 24, or provided inside the memory I/F 22. Moreover, in the example of FIG. 3, the determination unit 244 is provided inside the encoding unit/decoding unit 24. However, the determination unit 244 may be provided inside the control unit 23, or may be provided separately from the encoding unit/decoding unit 24.

FIG. 6 is a diagram illustrating an example of a storage method for distributing a code word group across CHIPs. As described above, in the embodiment, code words forming a code word group as described above are distributed to and stored in CHIPs. As illustrated in FIG. 6, first code words #1 to #4 form a first code word group. In other words, the first code words #1 to #4 are code words generated by duplicating the same code word. Moreover, second code words #1 to #4 form a second code word group. Moreover, third code words #1 to #4 form a third code word group. In this manner, in the example of FIG. 6, code words forming each code word group are stored respectively in different CHIPs. In this manner, code words forming one code word group are distributed to and stored in a plurality of CHIPs. Accordingly, if the progress of wear is different among the CHIPs, the possibility of being able to correct an error is increased.

Figures 7, 8:
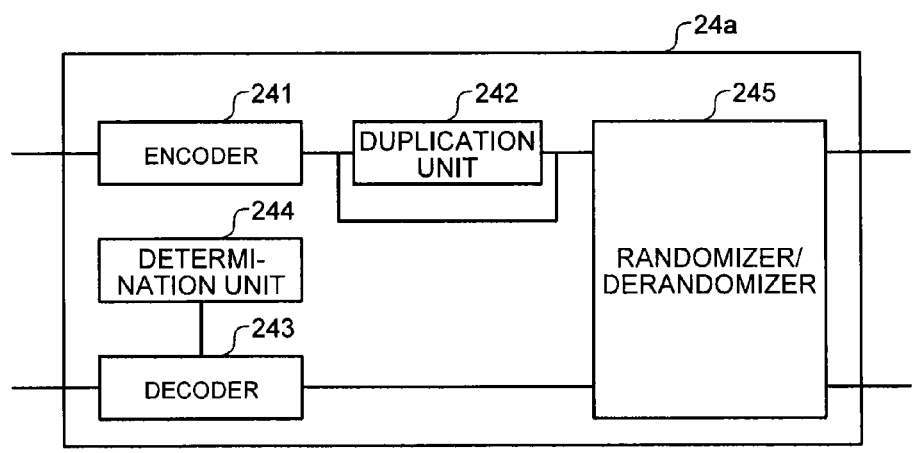
FIG. 7 is a diagram illustrating an example of a storage method for distributing a code word group within a page.
FIG. 8 is a diagram illustrating a configuration example of an encoding unit/decoding unit in a storage device (semiconductor storage device) according to a second embodiment.

FIG. 7 is a diagram illustrating an example of a storage method in which a code word group is distributed within a page. As in the example of FIG. 6, the first code words #1 to #4 form the first code word group. The second code words #1 to #4 form the second code word group. The third code words #1 to #4 form the third code word group. One row in FIG. 7 corresponds to one page. As described above, in the NAND memory, a memory cell is connected to a word line, and also connected to a bit line. Generally, the same bit line is controlled by the same circuit (column control circuit). Therefore, if a failure occurs in the column control circuit, the possibility of being able to correct errors within a page is increased. Moreover, as described above, a code word group may similarly be distributed and stored across pages or blocks.

The majority decision process may be performed using not all code words of a code word group but a part of the code words of the code word group. For example, if the code word group includes six code words, three out of the six code words forming the code word group may be used to perform the majority decision process, and decode a code word of the majority decision process.

Moreover, in the embodiment, the majority decision process is performed if error corrections were unsuccessful for all code words of a code word group duplicated from the same code word upon reading from the semiconductor memory unit 3. However, the majority decision process may be performed from the beginning without decoding each code word of the code word group. For example, if the code word group is stored in the same page, the code words of the code word group are simultaneously read out. In such a case, the majority decision process may be performed from the beginning without decoding the code words of the code word group to decode a code word as a result of the majority decision process.

As described above, in the embodiment, one code word is duplicated to be stored in a plurality of memory areas in the semiconductor memory unit 3. If error corrections of all the code words of the code word group duplicated from the same code word result in failure upon reading from the semiconductor memory unit 3, a result of majority decision is obtained for each bit of the code words of the code word group, and a code word obtained as the results of the majority decision is decoded to correct an error. Hence, the probability of enabling the error correction can be increased.

In the embodiment, the description has been given taking an example of BCH encoding that performs encoding, bit by bit. However, also in a case where encoding is performed, symbol by symbol, as in the RS code or the like, the majority decision process is performed, bit by bit, or symbol by symbol, and accordingly the probability of enabling the error correction can be similarly increased.

(Second Embodiment)

FIG. 8 is a diagram illustrating a configuration example of an encoding unit/decoding unit 24a in a storage device (semiconductor storage device) according to the second embodiment. The configuration of the semiconductor storage device of the embodiment is similar to that of the semiconductor storage device 1 of the first embodiment, apart from the point that the encoding unit/decoding unit 24 of the first embodiment is replaced with the encoding unit/decoding unit 24a. Hereinafter, the same reference numerals as those of the first embodiment are assigned to components having similar functions to those of the first embodiment. The overlapping descriptions are omitted. Hereinafter, parts different from the first embodiment are described.

The encoding unit/decoding unit 24a of the embodiment has a configuration in which a randomizer/derandomizer 245 has been added to the encoding unit/decoding unit 24 of the first embodiment. The randomizer/derandomizer 245 randomizes a code word to be stored in the semiconductor memory unit 3. The memory I/F 22 stores the randomized code word in the semiconductor memory unit 3. Moreover, the randomizer/derandomizer 245 derandomizes a code word read from the semiconductor memory unit 3 and inputs it into the decoding unit 243. FIG. 8 illustrates the example where the encoding unit/decoding unit 24a includes the randomizer/derandomizer 245. However, the memory I/F 22 may include the randomizer/derandomizer 245.

The randomizer/derandomizer 245 randomizes a code word using a specified randomization key. In the NAND memory, the property where which of an error to wrongly read out an original value, "0", as "1", and an error to wrongly read out an original value, "1", as "0" is more likely to occur is different depending on the factor of a reduction in the reliability of a memory cell. For example, if code words forming a code word group are stored respectively in two memory areas where the reliability has been decreased due to the same factor, the two code words have also the same tendency of error occurrence. The majority decision process is based on the precondition that the occurrence of an error of each bit is random. Therefore, if such an error having a constant tendency occurs, the possibility of being able to obtain a right result decreases.

In the embodiment, randomization is performed using a different randomization key for each code word forming a code word group in order to avoid the above phenomenon. Consequently, even if the original code word is the same, actual values to be stored in the semiconductor memory unit 3 are distributed to "0" and "1". Accordingly, even if errors having the same tendency are likely to occur, it is possible to increase the possibility of existence of data that is not wrong. In terms of the randomization key, for example, the control unit 23 may instruct the randomizer/derandomizer 245 according to the code word, or the randomizer/derandomizer 245 may previously hold a randomization key per code word within a code word group and use different randomization keys depending on the code word within the code word group.

Figure 9:
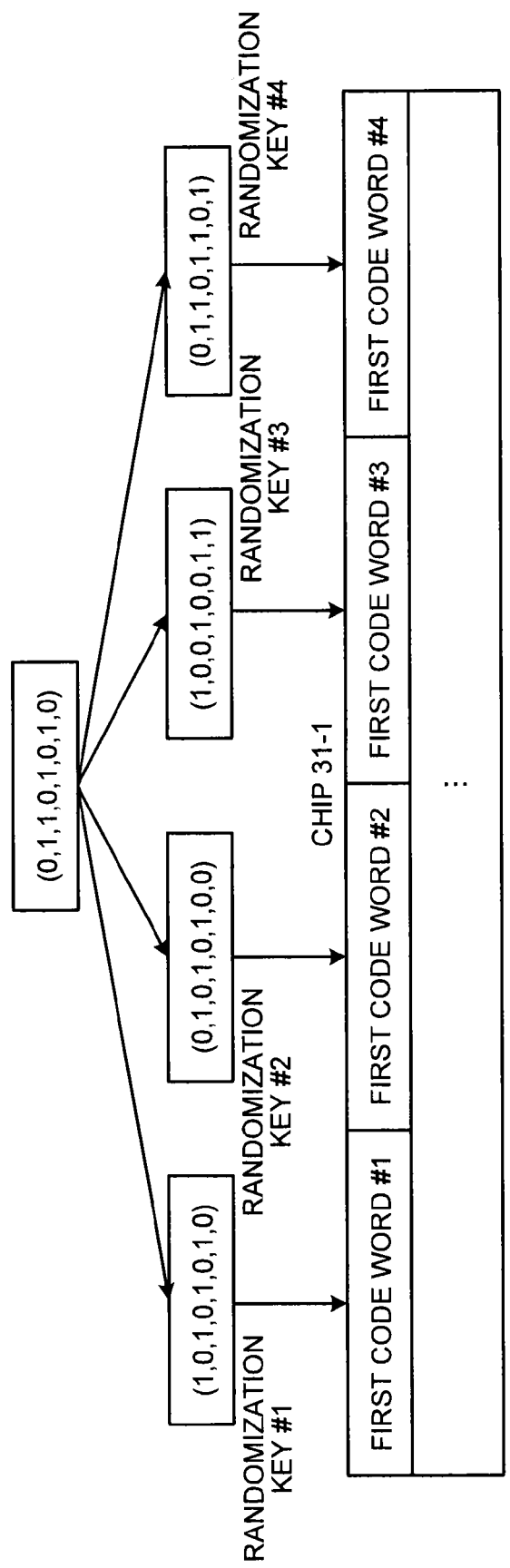
FIG. 9 is a diagram illustrating an example of code words when using different randomization keys depending on the code word included in a code word group.

FIG. 9 is a diagram illustrating an example of code words when using different randomization keys depending on the code word included in a code word group. The first code words #1 to #4 in FIG. 9 form the first code word group. In other words, the first code words #1 to #4 are code words generated by duplicating the same code word. A randomization key #1 is used to randomize the first code word #1. A randomization key #2 is used to randomize the first code word #2. A randomization key #3 is used to randomize the first code word #3. A randomization key #4 is used to randomize the first code word #4. FIG. 9 illustrates the example where the code words are distributed and stored within a page. However, if the code words are distributed across blocks, and also if distributed across CHIPs, different randomization keys can similarly be used depending on the code word.

Upon reading from the semiconductor memory unit 3, the decoding process is performed on a derandomized code word as in the first embodiment. If error corrections cannot be made for all code words forming a code word group, the majority decision process is performed as in the first embodiment. The operations of the embodiment apart from those described above are similar to those of the first embodiment.

Moreover, in the above embodiment, randomization is performed. However, instead of randomization, a pattern in which bit values are reversed in a part of code words of a code word group may be written. For example, if an original code word is "1010", a half of code words among the code words of a code word group are left "1010", just as it is, and each bit is reversed to "0101" in the remaining half of the code words. Also in this manner, it is possible to increase the possibility of being able to correct errors even if errors that are not random but have the same tendency occur.

As described above, in the embodiment, different randomization keys are used depending on the code word included in a code word group. Hence, a similar effect to the first embodiment can be obtained. The possibility of being able to correct errors can also be increased even if errors that are not random but have the same tendency occur.

(Third Embodiment)

Figure 10:
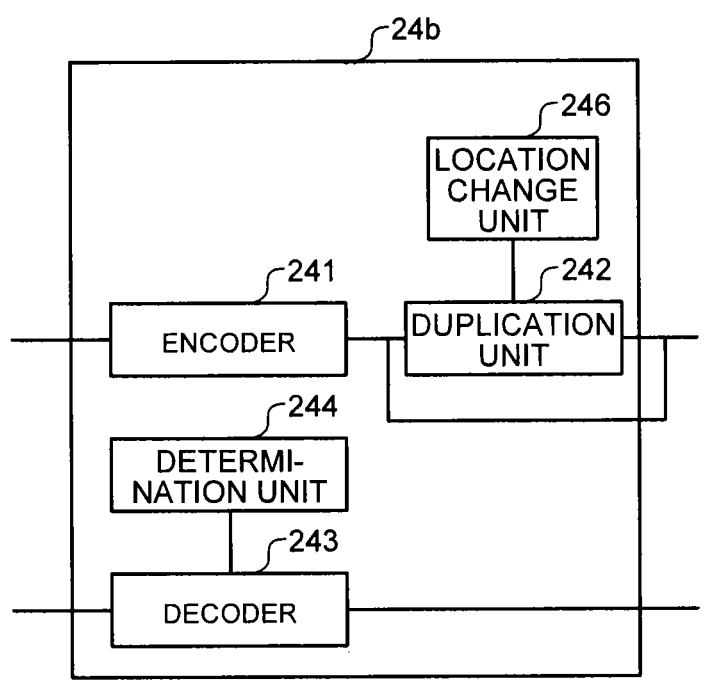
FIG. 10 is a diagram illustrating a configuration example of an encoding unit/decoding unit in a storage device (semiconductor storage device) according to a third embodiment.

FIG. 10 is a diagram illustrating a configuration example of an encoding unit/decoding unit 24b in a storage device (semiconductor storage device) according to a third embodiment. The configuration of the semiconductor storage device of the embodiment is similar to that of the semiconductor storage device 1 of the first embodiment, apart from the point that the encoding unit/decoding unit 24 of the first embodiment is replaced with the encoding unit/decoding unit 24b. Hereinafter, the same reference numerals as those of the first embodiment are assigned to components having similar functions to those of the first embodiment. The overlapping descriptions are omitted. Hereinafter, parts different from the first embodiment are described.

The encoding unit/decoding unit 24b of the embodiment has a configuration in which a location change unit 246 has been added to the encoding unit/decoding unit 24 of the first embodiment. The location change unit 246 performs a location change process, such as bit shifting or shuffling, on a code word duplicated by the duplication unit 242.

As described in the first embodiment, memory cells connected to the same bit line are connected to the same column control circuit. If the column control circuit fails, the probability of error occurrence in the memory cells controlled by the column control circuit increases. In other words, an error tends to occur at a specific bit location in each memory cell group. As described in the first embodiment, for example, if the code words #1 to #4 forming the code word group are distributed and stored across pages, memory cells that store data at the same bit location are controlled by the same column control circuit, for example, first bits of the code words #1 to #4 are controlled by the same control circuit, and second bits of the code words #1 to #4 are controlled by the same column control circuit. In such a case, read errors occur in data at the same bit location of the code words.

Figure 11:
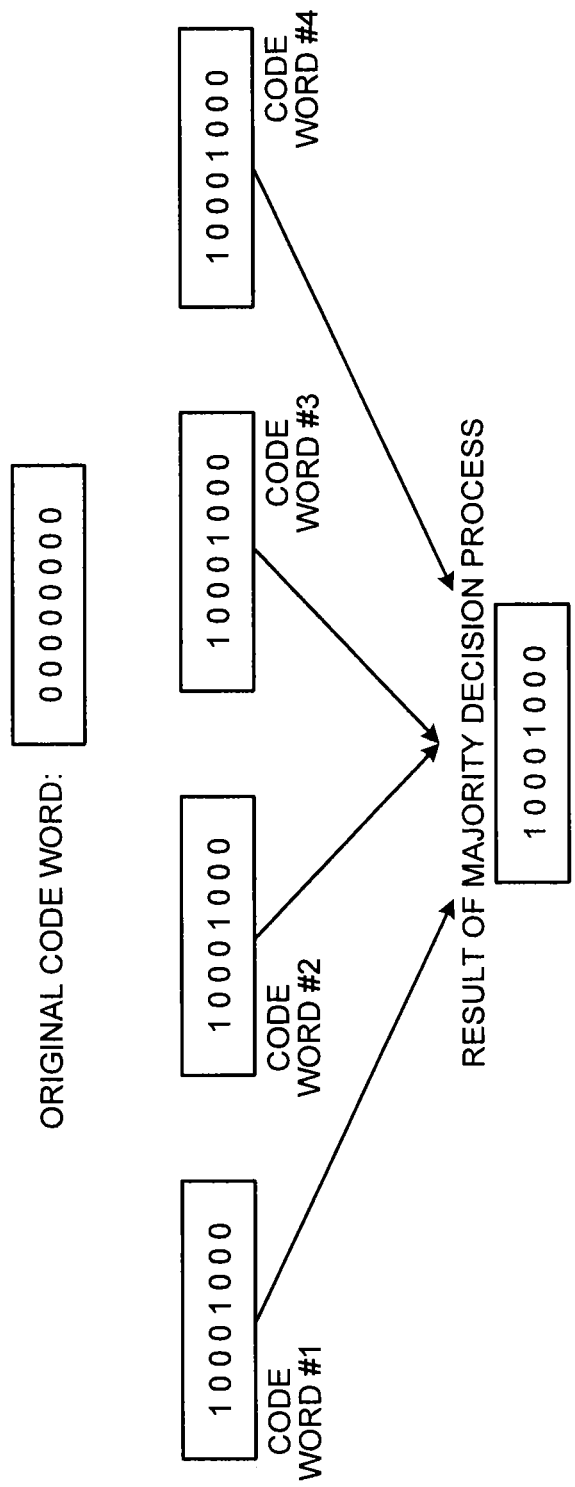
FIG. 11 is a diagram illustrating an example of an error dependent on a bit location.

FIG. 11 is a diagram illustrating an example of an error dependent on a bit location. The code words #1 to #4 in FIG. 11 form the same code word group. Assume that an original code word is "00000000", and failures have occurred in column control circuits connected to memory cells corresponding to a first and a fourth bit location from the left. In this case, read errors occur at the first and fourth bit locations from the left in all the code words #1 to #4. As described in the first embodiment, if a majority decision is made on a bit-by-bit basis, when an error dependent on a bit location occurs in this manner, the error cannot be corrected even if the majority decision process is performed.

Figure 12:
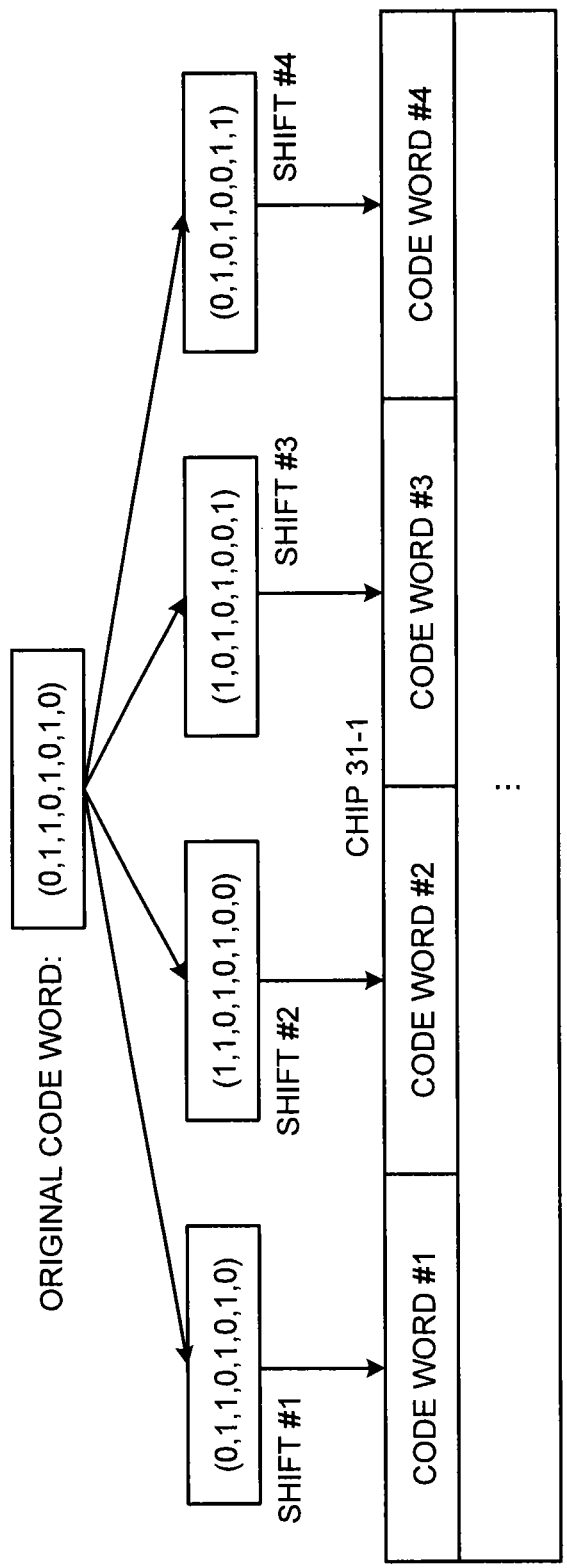
FIG. 12 is a diagram illustrating an example of bit shifting of the third embodiment.

In the embodiment, in order to increase the probability of enabling error correction also in a case where an error dependent on a bit location occurs in this manner, bit shifting is performed with a different shift amount depending on the code word included in a code word group. FIG. 12 is a diagram illustrating an example of bit shifting of the embodiment. The code words #1 to #4 in FIG. 12 form the same code word group. Bit shifting is performed on the code word #1 with a shift amount of zero as a shift #1. Bit shifting is performed on the code word #2 with a shift amount of one as a shift #2. Bit shifting is performed on the code word #3 with a shift amount of two as a shift #3. Bit shifting is performed on the code word #4 with a shift amount of three as a shift #4. In FIG. 12, the bits are shifted to the left. However, the bits may be shifted to the right. Moreover, in FIG. 12, the shift amount is changed by one bit for each code word. However, the shift amounts of bit shifting to be performed on code words are required to be shift amounts different among the code words forming the code word group. Accordingly, the shift amounts are not limited to the example of FIG. 12. Moreover, there may be the same shift amount among the code words forming the same code word group.

Moreover, the process is not limited to bit shifting. Any process can be performed as long as it is a process of rearranging the locations in each code word forming the same code word group. For example, a process of shuffling in each code word, in other words, a process of rearranging bit values in a code word by different rules depending on the code word, or a process of rearranging bit values in random order, may be performed.

When performing the majority decision process, the location change unit 246 performs a location change process reverse to the process upon writing, on code words read from the semiconductor memory unit 3 and accordingly recovers the original code words, and then inputs the code words into the determination unit 244. The determination unit 244 uses the code words in which the original arrangement of the bits has been recovered, and performs the majority decision process as described above. The decoding unit 243 then decodes a code word as a result of the majority decision process.

Moreover, bit locations may not be changed within one code word, but may be changed across a plurality of code words. For example, if a code word "1010" is duplicated to write a sum of four code words #1 to #4, when the four duplicates of "1010" are arranged (coupled), it results in "1010101010101010". The rearrangement of locations may be made within the 16-bit data (the entire bit string) being the coupled result to divide the rearranged 16 bits into four code words (divided code words). For example, the whole 16 bits are rearranged to "1111000011110000". The code words #1, #2, #3, and #4 are written into the semiconductor memory unit 3, respectively as "1111", "0000", "1111", and "0000". The rearrangement method is not limited to this example. If bit locations are changed across a plurality of code words in this manner, all the code words forming a code word group, that is, the entire bit string is read out upon decoding. When performing the majority decision process, the location change unit 246 rearranges the entire bit string read from the semiconductor memory unit 3 to the original code words, and input them into the determination unit 244. The determination unit 244 uses the rearranged and recovered code words to perform the majority decision process as described above. The decoding unit 243 then decodes a code word being a result of the majority decision process.

Moreover, in the embodiment, the location change unit 246 has been added to the semiconductor storage device of the first embodiment to make rearrangements. However, the location change unit 246 may be added to the semiconductor storage device of the second embodiment to make rearrangements.

As described above, in the embodiment, the location change process such as bit shifting or shuffling with different shift amounts is performed on code words forming a code word group. Hence, if an error dependent on a bit location occurs, the possibility of being able to correct the error can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising:
   an encoding unit configured to encode data and generate a first code word;
   a duplication unit configured to duplicate the first code word;
   a memory interface configured to write, into a non-volatile memory, a code word group including the first code word and a plurality of code words being duplicates of the first code word, and read, from the non-volatile memory, the first code word and the plurality of code words, which form the code word group;
   a determination unit configured to obtain a result of majority decision using the first code word and the plurality of code words, which are included in the code word group read from the non-volatile memory; and
   a decoding unit configured to decode a second code word being the result of the majority decision.

2. The memory controller according to claim 1, wherein the decoding unit decodes each of the first code word and the plurality of code words, which have been read from the non--volatile memory, and makes an error correction, and
   upon the decoding unit failing in error corrections of all of the first code word and the plurality of code words, the determination unit obtains a result of majority decision on a bit-by-bit basis by using the first code word and the plurality of code words.

3. The memory controller according to claim 1, wherein the non-volatile memory includes a plurality of chips, and
   the memory interface distributes and writes the first code word and the plurality of code words, which form the code word group, respectively to the plurality of chips.

4. The memory controller according to claim 1, wherein the memory interface writes the first code word and the plurality of code words, which form the code word group, into a memory cell group connected to the same word line.

5. The memory controller according to claim 1, further comprising a randomizer/derandomizer configured to randomize the first code word and the plurality of code words, which form the code word group, and derandomize the first code word and the plurality of code words, which have been read from the non-volatile memory, wherein
   the memory interface writes the randomized first code word and plurality of code words into the non-volatile memory, and
   the determination unit obtains the result of the majority decision by using the derandomized first code word and plurality of code words.

6. The memory controller according to claim 1, further comprising a location change unit configured to rearrange bit locations in the first code word and the plurality of code words, which form the code word group, by different rules depending on the code word.

7. The memory controller according to claim 6, wherein the location change unit shifts bits in the first code word and the plurality of code words, which form the code word group, by different shift amounts depending on the code word.

8. The memory controller according to claim 1, wherein bit locations in an entire bit string in which the first code word and the plurality of code words, which form the code word group, are coupled are rearranged,
   the rearranged entire bit string is divided into a plurality of third code words, and
   the memory controller writes the plurality of third code words into the non-volatile memory.

9. The memory controller according to claim 1, wherein the memory interface reads the first code word and the plurality of code words, which form the code word group, from the non-volatile memory based on a read request from a host.

10. A storage device comprising:
    a non-volatile memory;
    an encoding unit configured to encode data and generate a first code word;
    a duplication unit configured to duplicate the first code word;
    a memory interface configured to write, into the non-volatile memory, a code word group including the first code word and a plurality of code words being duplicates of the first code word, and read, from the nonvolatile memory, the first code word and the plurality of code words, which form the code word group;

a determination unit configured to obtain a result of majority decision using the first code word and the plurality of code words, which are included in the code word group read from the non-volatile memory; and a decoding unit configured to decode a second code word being the result of the majority decision and correct an error.

11. The storage device according to claim 10, wherein
the decoding unit decodes each of the first code word and the plurality of code words, which have been read from the non-volatile memory, and makes an error correction, and upon the decoding unit failing in error corrections of all of the first code word and the plurality of code words, the determination unit obtains a result of majority decision on a bit-by-bit basis by using the first code word and the plurality of code words.

12. The storage device according to claim 10, wherein
the non-volatile memory includes a plurality of chips, and
the memory interface distributes and writes the first code word and the plurality of code words, which form the code word group, respectively to the plurality of chips.

13. The storage device according to claim 10, wherein the memory interface writes the first code word and the plurality of code words, which form the code word group, into a memory cell group connected to the same word line.

14. The storage device according to claim 10, further comprising a randomizer/derandomizer configured to randomize the first code word and the plurality of code words, which form the code word group, and derandomize the first code word and the plurality of code words, which have been read from the non-volatile memory, wherein the memory interface writes the randomized first code word and plurality of code words into the non-volatile memory, and the determination unit obtains the result of the majority decision by using the derandomized first code word and plurality of code words.

15. The storage device according to claim 10, further comprising a location change unit configured to rearrange bit locations in the first code word and the plurality of code words, which form the code word group, by different rules depending on the code word.

16. The storage device according to claim 15, wherein the location change unit shifts bits in the first code word and the plurality of code words, which form the code word group, by different shift amounts depending on the code word.

17. The storage device according to claim 10, wherein
bit locations in an entire bit string in which the first code word and the plurality of code words, which form the code word group, are coupled are rearranged, the rearranged entire bit string is divided into a plurality of third code words, and the memory controller writes the plurality of third code words into the non-volatile memory.

18. The storage device according to claim 10, wherein the memory interface reads the first code word and the plurality of code words, which form the code word group, from the non-volatile memory based on a read request from a host.

19. A memory control method being performed by a memory controller, the memory control method comprising:
encoding data and generating a first code word;
duplicating the first code word;
writing, into a non-volatile memory, a code word group including the first code word and a plurality of code words being duplicates of the first code word;
reading, from the non-volatile memory, the first code word and the plurality of code words, which form the code word group;
obtaining a result of majority decision on a bit-by-bit basis, using the first code word and the plurality of code words, which are included in the code word group read from the non-volatile memory; and
decoding a second code word being the result of the majority decision and correcting an error.

* * * * *